US011668500B2

United States Patent
Liu et al.

(10) Patent No.: US 11,668,500 B2
(45) Date of Patent: Jun. 6, 2023

(54) COOLING SYSTEM AND CONTROL METHOD THEREFOR

(71) Applicant: Gree Electric Appliances, Inc. of Zhuhai, Guangdong (CN)

(72) Inventors: Hua Liu, Guangdong (CN); Zhiping Zhang, Guangdong (CN); Hongbo Li, Guangdong (CN); Hu Liang, Guangdong (CN); Xianquan Liu, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 137 days.

(21) Appl. No.: 17/261,656

(22) PCT Filed: Jul. 27, 2018

(86) PCT No.: PCT/CN2018/121888
§ 371 (c)(1),
(2) Date: Jan. 20, 2021

(87) PCT Pub. No.: WO2020/019641
PCT Pub. Date: Jan. 30, 2020

(65) Prior Publication Data
US 2021/0262712 A1    Aug. 26, 2021

(30) Foreign Application Priority Data

Jul. 27, 2018 (CN) .......................... 201810845984.1

(51) Int. Cl.
*F25B 41/40* (2021.01)
*F25B 41/22* (2021.01)
(Continued)

(52) U.S. Cl.
CPC ................ *F25B 41/22* (2021.01); *F25B 1/00* (2013.01); *F25B 41/40* (2021.01); *F25B 49/02* (2013.01)

(58) Field of Classification Search
CPC .. F25B 41/22; F25B 41/40; F25B 1/00; F25B 49/02
See application file for complete search history.

(56) References Cited

U.S. PATENT DOCUMENTS

| 3,698,204 A | 10/1972 | Schlotterbeck et al. |
| 2016/0128241 A1* | 5/2016 | Broglia .............. H05K 7/20945 62/228.4 |

FOREIGN PATENT DOCUMENTS

| CN | 103307715 A | 9/2013 |
| CN | 203518310 U | 4/2014 |

(Continued)

*Primary Examiner* — Nael N Babaa
(74) *Attorney, Agent, or Firm* — The Webb Law Firm

(57) ABSTRACT

The present application discloses a cooling system and a control method thereof; the cooling system includes a compressor unit, a condenser, a first solenoid valve, a second solenoid valve, a first throttle valve and a frequency converter; the second solenoid valve and the first throttle valve are connected with the first solenoid valve in parallel after being connected in series with each other; the compressor unit, the condenser, the first solenoid valve and the frequency converter are connected in series to form a first cooling loop; the compressor unit, the condenser, the second solenoid valve, the first throttle valve and the frequency converter are connected in series to form a second cooling loop; and the frequency converter is internally provided with a temperature detection module and a heat exchange module.

15 Claims, 1 Drawing Sheet

(51) Int. Cl.
*F25B 1/00* (2006.01)
*F25B 49/02* (2006.01)

(56) References Cited

FOREIGN PATENT DOCUMENTS

| | | |
|---|---|---|
| CN | 104633873 A | 5/2015 |
| CN | 104729162 A | 6/2015 |
| CN | 107152817 A | 9/2017 |
| CN | 107741111 A | 2/2018 |
| CN | 108176942 A | 6/2018 |
| CN | 108775721 A | 11/2018 |
| CN | 208671411 U | 3/2019 |
| EP | 3264008 A1 | 1/2018 |
| EP | 3287714 A1 | 2/2018 |
| WO | 2007022779 A1 | 3/2007 |
| WO | 2016166806 A1 | 10/2016 |

\* cited by examiner

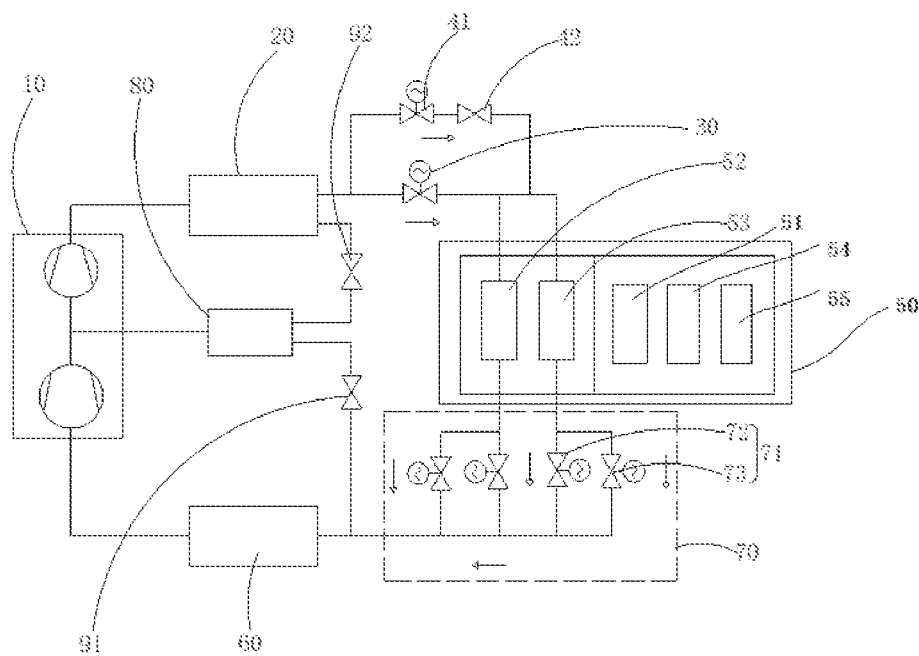

COOLING SYSTEM AND CONTROL METHOD THEREFOR

CROSS-REFERENCE TO RELATED APPLICATIONS

This application is the United States national phase of International Application No. PCT/CN2018/121888 filed Dec. 19, 2018, and claims priority to Chinese Patent Application No. 201810845984.1 filed Jul. 27, 2018, the disclosures of which are hereby incorporated by reference in their entirety.

TECHNICAL FIELD

The present application relates to the field of cooling systems, in particular to a cooling system and a control method thereof.

BACKGROUND TECHNOLOGY

A variable-frequency water cooling unit realizes adjustment of the operating load of the unit by changing the operating frequency (rotating speed) of a compressor unit so as to meet different cooling requirements. A frequency converter is a control system used to control and adjust the operating frequency (rotating speed) of the compressor unit. Therefore, guaranteeing the normal operation of the frequency converter is a prerequisite for stable operation of an air conditioning unit.

The frequency converter will generate heat under a working condition, and a rectifier module, an inverter module and a reactor are the main heat generation components. The greater the operating power of the frequency converter, the greater the heat generation; if the heat is not taken away in time, the temperature of the frequency converter will rise continuously; when the temperature is higher than a limit value, the components will be damaged and the frequency converter cannot work normally. In order to guarantee normal operation of the frequency converter, the cooling problem of the frequency converter needs to be solved.

A conventional frequency converter generally adopts a refrigerant for cooling; the cooling of the refrigerant has the advantages as follows: the cooling of the refrigerant directly adopts the liquid from the air conditioning unit; a cooling loop is a closed loop which is isolated from the environment to avoid the problem of scaling; the cooling efficiency of the refrigerant is high; the cooling system is simple in structure and small in size; the cooling of the refrigerant is also stable in temperature; and the cooling effect is good. However, in an existing refrigerant cooling system, the refrigerant will be throttled before cooling in the frequency converter; the temperature is relatively low; when the unit runs for a long time under a low-load working condition, as the operating power of the frequency converter is relatively small, the heat generation of the frequency converter is relatively low, and the refrigerant at a relatively low temperature enters the frequency converter to cause that the surface temperature of elements such as a refrigerant liquid supply copper pipe, a frequency converter cooling plate, etc. inside the frequency converter is too low; if the air tightness of the frequency converter is not good, wet air will enter the frequency converter to generate condensation water at these places of which the surface temperature is relatively low; and if the condensation water is accumulated in the frequency converter, damages of the frequency converter will be caused.

SUMMARY OF THE INVENTION

Based on this, the present application provides a cooling system and a control method thereof, which can solve the problems that condensation will be generated in the frequency converter when the compressor unit runs under a low-load working condition and the frequency converter will be damaged by burning due to overtemperature when the compressor unit runs under a high-load working condition.

In order to achieve the purpose of the present application, the present application adopts the following technical solutions:

A cooling system, comprising a compressor unit, a condenser, a first solenoid valve, a second solenoid valve, a first throttle valve and a frequency converter; the second solenoid valve and the first throttle valve are connected with the first solenoid valve in parallel after being connected in series; the compressor unit, the condenser, the first solenoid valve and the frequency converter are connected in series to form a first cooling loop; the compressor unit, the condenser, the second solenoid valve, the first throttle valve and the frequency converter are connected in series to form a second cooling loop; and the frequency converter is internally provided with a temperature detection module and a heat exchange module;

if the temperature detection module detects that the temperature in the frequency converter is lower than a switching temperature T, the first solenoid valve is opened, the second solenoid valve is closed, the first cooling loop is opened, and the second cooling loop is closed; and if the temperature detection module detects that the temperature in the frequency converter is equal to or higher than the switching temperature T, the first solenoid valve is closed, the second solenoid valve is opened, the first cooling loop is closed, and the second cooling loop is opened.

In one of the embodiments, the cooling system further comprises a cooling capacity adjustment module located between the compressor unit and the frequency converter, and the cooling capacity adjustment module is used to adjust the flow of the refrigerant passing through the frequency converter.

In one of the embodiments, the cooling capacity adjustment module comprises at least one cooling capacity adjustment assembly, and each cooling capacity adjustment assembly comprises an electronic expansion valve.

In one of the embodiments, at least cooling capacity adjustment assemblies are provided, and the cooling capacity adjustment assemblies are arranged in parallel.

In one of the embodiments, each cooling capacity adjustment assembly further includes a third solenoid valve connected in parallel with the electronic expansion valve.

In one of the embodiments, the frequency converter is internally provided with an inverter module, a rectifier module and a reactor.

In one of the embodiments, the cooling system further comprises an evaporator located between the cooling capacity adjustment assembly and the compressor unit.

A control method of the cooling system, wherein the cooling system comprises a compressor unit, a condenser, a first solenoid valve, a second solenoid valve, a first throttle valve and a frequency converter; the second solenoid valve and the first throttle valve are connected with the first solenoid valve in parallel after being connected in series with each other; the compressor unit, the condenser, the first solenoid valve and the frequency converter are connected in series to form a first cooling loop; the compressor unit, the condenser, the second solenoid valve, the first throttle valve and the frequency converter are connected in series to form a second cooling loop; the frequency converter is internally provided with a temperature detection module and a heat exchange module; the control method of the cooling system includes the following steps of:

detecting the temperature in the frequency converter by using the temperature detection module;

if the temperature in the frequency converter is lower than a switching temperature T, opening the first solenoid valve, closing second solenoid valve, opening the first cooling loop, and closing the second cooling loop; and if the temperature in the frequency converter is equal to or higher than the switching temperature T, closing the first solenoid valve, opening the second solenoid valve, closing the first cooling loop, and opening the second cooling loop.

A control method of the cooling system, wherein the cooling system comprises a compressor unit, a condenser, a first solenoid valve, a second solenoid valve, a first throttle valve and a frequency converter; the second solenoid valve and the first throttle valve are connected with the first solenoid valve in parallel after being connected in series with each other; the compressor unit, the condenser, the first solenoid valve and the frequency converter are connected in series to form a first cooling loop; the compressor unit, the condenser, the second solenoid valve, the first throttle valve and the frequency converter are connected in series to form a second cooling loop; the frequency converter is internally provided with a temperature detection module; the cooling system further comprises a cooling capacity adjustment module located between the compressor unit and the frequency converter and used to adjust the flow of the refrigerant passing through the frequency converter; the cooling capacity adjustment module comprises at least one cooling capacity adjustment assembly; each cooling capacity adjustment assembly comprises an electronic expansion valve; the control method of the cooling system includes the following steps of:

detecting the temperature in the frequency converter by using the temperature detection module;

if the temperature in the inverter is lower than the switching temperature T, opening the first solenoid valve, closing the second solenoid valve, opening the first cooling loop, and closing the second cooling loop; when the first cooling loop is opened, controlling the opening degree of the electronic expansion valve according to whether the temperature of the frequency converter exceeds the target temperature range T0 (Ta, Tb) or not, wherein Tb<T; if the temperature detection module detects that the temperature of the frequency converter is within the target temperature range T0, maintaining the opening degree of the electronic expansion valve at a predetermined size; if the temperature detection module detects that the temperature of the frequency converter is higher than Tb, increasing the opening degree of the electronic expansion valve; if the temperature detection module detects that the temperature of the frequency converter is lower than the target temperature range Ta, reducing the opening degree of the electronic expansion valve; and if the temperature in the frequency converter is equal to or higher than the switching temperature T, closing the first solenoid valve, opening the second solenoid valve, closing the first cooling loop, and opening the second cooling loop.

A control method of the cooling system, wherein the cooling system comprises a compressor unit, a condenser, a first solenoid valve, a second solenoid valve, a first throttle valve and a frequency converter; the second solenoid valve and the first throttle valve are connected with the first solenoid valve in parallel after being connected in series; the compressor unit, the condenser, the first solenoid valve and the frequency converter are connected in series to form a first cooling loop; the compressor unit, the condenser, the second solenoid valve, the first throttle valve and the frequency converter are connected in series to form a second cooling loop; the frequency converter is internally provided with a temperature detection module and a heat exchange module; the cooling system further comprises a cooling capacity adjustment module located between the compressor unit and the frequency converter and used to adjust the flow of the refrigerant passing through the frequency converter; the cooling capacity adjustment module comprises at least one cooling capacity adjustment assembly; each cooling capacity adjustment assembly comprises an electronic expansion valve and a third solenoid valve which is connected with the electronic expansion valve in parallel; the control method of the cooling system includes the following steps of:

detecting the temperature in the frequency converter by using the temperature detection module;

if the temperature in the frequency converter is lower than a switching temperature T, opening the first solenoid valve, closing second solenoid valve, opening the first cooling loop, and closing the second cooling loop;

if the temperature in the frequency converter is equal to or higher than the switching temperature T, closing the first solenoid valve, opening the second solenoid valve, closing the first cooling loop, and opening the second cooling loop;

controlling the opening degree of the electronic expansion valve according to whether the temperature of the frequency converter exceeds the target temperature range T0 (Ta, Tb) or not, wherein Tb<T; if the temperature detection module detects that the temperature of the frequency converter is within the target temperature range T0, maintaining the opening degree of the electronic expansion valve at a predetermined size; if the temperature detection module detects that the temperature of the frequency converter is higher than Tb, increasing the opening degree of the electronic expansion valve; if the temperature detection module detects that the temperature of the frequency converter is lower than the target temperature range Ta, reducing the opening degree of the electronic expansion valve;

controlling the opening and closing of the third solenoid valve according to a set temperature T1 of a first frequency converter and a set temperature T2 of a second frequency converter, wherein T2<Ta<Tb<T1<T; if the temperature detection module detects that the temperature of the frequency converter is higher than the set temperature T1 of the first frequency converter, opening the third solenoid valve, continuously increasing the opening degree of the electronic expansion valve until the opening degree reaches a maximum opening degree; if the temperature detection module detects that the temperature of the frequency converter is lower than the set temperature T2 of the second frequency converter, closing the third solenoid valve, and afterwards controlling the operation of the opening degree of the electronic expansion valve by comparing whether the temperature of the frequency converter exceeds the target temperature range T0 or not.

In one of the embodiments, after the second cooling loop is opened, if the third solenoid valve is closed, and the operating opening degree of the electronic expansion valve is smaller than a set opening degree all the time within a set time, the cooling system is switched to the first cooling loop, and the second cooling loop is closed; during switching, the third solenoid valve is firstly opened, subsequently the first solenoid valve is opened, and then the second solenoid valve is closed to complete the switching.

In one of the embodiments, the set time is 30 min to 60 min.

In one of the embodiments, the set opening degree is smaller than or equal to 25% of the maximum opening degree.

The beneficial effects of the present application are that the cooling system of the present application adopts a first cooling loop without a first throttle valve and a second cooling loop with a first throttle valve; the first cooling loop can be used for cooling the frequency converter when the compressor unit runs under a low-load working condition; the refrigerant in the first cooling loop is not throttled before entering the frequency converter, and the temperature of liquid supply is relatively high, so the first cooling loop can realize the cooling of the frequency converter when the compressor unit runs under a low-load working condition so as to prevent condensation of the frequency converter; the second cooling loop can be used for cooling the frequency converter when the compressor unit runs under a high-load working condition, the refrigerant in the second cooling loop is throttled by the first throttle valve before entering the frequency converter, and the temperature of the throttled refrigerant is relatively low, so the frequency converter can be provided with sufficient cooling capacity, and thus over-temperature of the frequency converter hardly occur.

BRIEF DESCRIPTION OF DRAWINGS

In order to more clearly describe the technical solutions in the embodiments of the present application or in the prior art, the drawings that need to be used in the description of the embodiments or the prior art will be briefly introduced below; obviously, the drawings in the following description are only the embodiments of the present application; and for those of ordinary skilled in the art, other drawings can further be obtained from the disclosed drawings without creative work.

FIG. 1 is a working principle diagram of one embodiment of the present application.

In FIG. 1:

10. Compressor unit; 20. Condenser; 30. First solenoid valve; 41. Second solenoid valve; 42. First throttle valve; 50. Frequency converter; 51. Reactor; 52. Inverter module; 53. Rectifier module; 60. Evaporator; 70. Cooling capacity adjustment module; 71. Cooling capacity adjustment assembly; 72. Electronic expansion valve; 73. Third solenoid valve; 80. Flash generator; 91. Second throttle valve; 92. Third throttle valve.

DETAILED DESCRIPTION OF THE EMBODIMENTS

The technical solutions in the embodiments of the present application will be described clearly and completely below in combination with the drawings in the embodiments of the present application; and apparently, the described embodiments are only a part of the embodiments of the present application instead of all of the embodiments. Based on the embodiments in the present application, all other embodiments obtained by those of ordinary skill in the art without making any creative work fall within the protection scope of the present disclosure.

In the description of the present application, it should be understood that the orientation or positional relationship indicated by the terms "length", "width", "top", "bottom", "inside", "outside", etc. is based on the orientation or positional relationship shown in the drawings, and is only for conveniently describing the present application and simplifying the description, rather than indicating or implying that the referred device or element must have a specific orientation and be constructed and operated in a specific orientation, and therefore it cannot be understood as a limitation of the present application.

In addition, the terms "first" and "second" are only used for a descriptive purpose, and cannot be understood as indicating or implying relative importance or implicitly indicating the number of indicated technical features. Thus, the features defined with "first" and "second" may explicitly or implicitly include one or more of these features.

In the description of the present application, unless otherwise clearly stated and limited, the terms "connected" and "fixed" should be understood in a broad sense; for example, it may be a fixed connection, or a detachable connection, or an integrated connection; it may be a mechanical connection or an electric connection; it may be a direct connection or an indirect connection through an intermediate medium; and it may be an internal communication between two elements or an interaction relationship between two elements. For those of ordinary skill in the art, the specific meanings of the above-mentioned terms in the present application can be understood under specific circumstances.

In the present application, unless otherwise clearly stated and defined, the first feature is "on" or "under" the second feature may include that the first feature and the second feature have direct contact, or may include that the first feature and the second feature have no direct contact but have a contact through other features therebetween.

The technical solutions of the present application will be further described below through specific embodiments in combination with the drawings.

As shown in FIG. 1, a cooling system of one embodiment of the present application is provided; the cooling system comprises a compressor unit 10, a condenser 20, a first solenoid valve 30, a second solenoid valve 41, a first throttle valve 42 and a frequency converter 50; the second solenoid valve 41 and the first throttle valve 42 are connected in series and connected with the first solenoid valve 30 in parallel; the compressor unit 10, the condenser 20, the first solenoid valve 30 and the frequency converter 50 are connected in series to form a first cooling loop; the compressor unit 10, the condenser 20, the second solenoid valve 41, the first throttle valve 42 and the frequency converter 50 are connected in series to form a second cooling loop; the frequency converter 50 is internally provided with a temperature detection module and a heat exchange module; and the heat exchange module is used for exchanging heat with the refrigerant to cool the frequency converter 50.

If the temperature detection module detects that the temperature in the frequency converter 50 is lower than the switching temperature, the first solenoid valve 30 is opened, the second solenoid valve 41 is closed, and the first cooling loop is opened; as the refrigerant in the first cooling loop is not throttled before entering the frequency converter 50, the temperature is relatively high, and thus the frequency converter 50 can be prevented from condensation when the compressor unit runs under a low-load working condition; if the temperature detection module detects that the temperature of the frequency converter 50 is higher than or equal to the switching temperature T, the first solenoid valve 30 is closed, the second solenoid valve 41 is opened, the first cooling loop is closed, and the cooling system is switched to the second cooling loop; as the refrigerant in the second cooling loop is firstly throttled by the first throttle valve 42 before entering the frequency converter 50, the temperature of the throttled refrigerant is relatively low, the frequency converter can be provided with sufficient cooling capacity, so that the frequency converter 50 hardly generate overtemperature when the compressor unit 10 runs under a high-load working condition.

Besides the temperature detection module and the heat exchange module, the frequency converter 50 is further internally provided with an inverter module 52, a rectifier module 53 and a reactor 51.

Optionally, the cooling system further comprises a cooling capacity adjustment module 70 located between the compressor unit 10 and the frequency converter 50, and the cooling capacity adjustment module 70 is used to adjust the flow of the refrigerant passing through the frequency converter 50 so as to adjust the cooling capacity of the frequency converter. The cooling capacity adjustment module 70 comprises at least one cooling capacity adjustment assembly 71, and each cooling capacity adjustment assembly 71 comprises an electronic expansion valve 72.

When the temperature of the frequency converter 50 is within the target temperature range T0, the opening degree of the electronic expansion valve 72 is maintained at the current opening degree; when the temperature of the frequency converter 50 is higher than Tb, the opening degree of the electronic expansion valve 72 becomes larger to increase the cooling capacity of the refrigerant to the frequency converter, thereby accelerating the cooling of the frequency converter 50; when the temperature of the frequency converter 50 is lower than the target temperature range T0, the opening degree of the electronic expansion valve 72 becomes smaller to reduce the cooling capacity of the refrigerant to the frequency converter 50, so that the frequency converter 50 can be heated to a target temperature range, thereby preventing condensation caused by excessive low temperature of the frequency converter 50.

Once the temperature detection module detects that the temperature of the frequency converter 50 is over-temperature, the compressor unit 10 will be shut down, but the frequency converter 50 will not generate condensation by a low temperature within a short time, so the electronic expansion valve 72 is opened quickly and closed slowly, namely the electronic expansion valve 72 is opened as quickly as possible to prevent over temperature of the frequency converter 50; for example, when the electronic expansion valve 72 is to be opened, every 5 seconds are considered as one action period; the electronic expansion valve 72 is opened by 20 steps (the total opening degree is 480 steps) in each action; the electronic expansion valve 72 can be closed a little slowly to prevent large temperature fluctuation; for example, when the electronic expansion valve 72 is to be closed, every five minutes are considered as one action period; and the electronic expansion valve 72 is closed by 10% based on the current opening degree in each action.

In order to reduce the workload of each electronic expansion valve 72, in one embodiment, at least cooling capacity adjustment assemblies 71 are provided, and the cooling capacity adjustment assemblies 71 are arranged in parallel.

Further, each cooling capacity adjustment assembly 71 further comprises a third solenoid valve 73 connected in parallel with the electronic expansion valve 72; the third solenoid valve 73 is controlled to be opened and closed according to a set temperature T1 of a first frequency converter and a set temperature T2 of a second frequency converter, wherein $T2<Ta<Tb<T1<T$; when the temperature of the frequency converter 50 is higher than the set temperature T1 of the first frequency converter, the third solenoid valve 73 is opened to increase the cooling capacity for the frequency converter 50, so that the frequency converter 50 is cooled, and thus the frequency converter 50 can be prevented from being burned out due to high temperature. When the third solenoid valve 73 is opened, the electronic expansion valve 72 connected in parallel with the third solenoid valve 73 is continuously opened until it is completely opened; when the temperature of the frequency converter 50 is lower than the set temperature T2, the third solenoid valve 73 is closed to reduce the cooling capacity of the frequency converter 50, so that the frequency converter 50 is heated to prevent condensation; and after the third solenoid valve 73 is closed, the opening degree of the electronic expansion valve 72 is controlled according to whether the temperature of the frequency converter 50 exceeds the target temperature range T0 or not.

When the second solenoid valve 41 and the third solenoid valve 73 are both opened, if the temperature detection module detects that the temperature of the frequency converter 50 is still higher than the switching temperature T all the time, maybe the condenser 20 has a fault which causes failed cooling of the frequency converter 50; in other implementable embodiments, the frequency converter 50 can be internally provided with a backup cooling module; when the temperature of the frequency converter 50 does not fall below a second target temperature range within a specified time, an external control device can be used to control the backup cooling module to work to cool the frequency converter 50 so as to reduce the temperature of the frequency converter 50 and prevent the working parts inside the frequency converter 50 from being burned out due to high temperature; for example, the backup cooling module adopts a semiconductor refrigerating device or other devices that can realize cooling of the frequency converter 50.

The cooling system further comprises an evaporator 60 located between the cooling capacity adjustment assembly 71 and the compressor unit 10, and the evaporator 60 is used to cool the cooling liquid passing through the frequency converter 50 again, so that the refrigerant can realize better cooling of the compressor unit 10 in work.

The cooling system further comprises a flash generator 80, and the condenser 20, the flash generator 80, the evaporator 60 and the compressor unit 10 are connected in series to form a refrigeration loop for cooling a room.

A pipeline connecting the flash generator 80 with the evaporator 60 is provided with a second throttle valve 91, a pipeline connecting the condenser 20 with the flash generator 80 is provided with a third throttle valve 92, and the second throttle valve 91 and the third throttle valve 92 are both used to adjust the flow of the refrigeration loop as required.

The above-mentioned cooling system adopts a first cooling loop without a first throttle valve 42 and a second cooling loop with a first throttle valve 42; the first cooling loop can be used for cooling the frequency converter when the compressor unit 10 runs under a low-load working condition; the refrigerant in the first cooling loop is not throttled before entering the frequency converter 50, and the temperature of liquid supply is relatively high, so the refrigerant can realize the cooling of the frequency converter 50 when the compressor unit 10 runs under a low-load working condition so as to prevent condensation of the frequency converter 50; the second cooling loop can be used when the compressor unit runs under a high-load working condition; the refrigerant in the second cooling loop is throttled by the first throttle valve 42 before entering the frequency converter 50, and the temperature of the throttled refrigerant is relatively low, so the refrigerant can realize the cooling of the frequency converter 50 when the compressor unit 10 runs under a high-load working condition. On the above basis, the third solenoid valve 73 is added to assist liquid supply of the electronic expansion valve 72; when the temperature of the frequency converter 50 is too high, the third solenoid valve 73 is opened quickly to increase the cooling flow passing through the frequency converter 50 and prevent over temperature of the frequency converter 50. During the operation of the compressor unit 10, by the control conception and method of quick opening and slow closing of the electronic expansion valve 72 and according to the load working condition of the compressor unit 10, the first cooling loop and the second cooling loop are flexibly switched by mutual cooperation of all valves, thereby effectively improving the reliability of the frequency converter and the compressor unit 10.

The present application further discloses a control method of the cooling system, and based on the above-mentioned cooling system, the control method specifically includes the following steps of:

S1, detecting the temperature in the frequency converter 50 by using the temperature detection module.

S2, if the temperature detection module detects that the temperature in the frequency converter 50 is lower than the switching temperature T, opening the first solenoid valve 30, closing the second solenoid valve 41, opening the first cooling loop, and closing the second cooling loop.

S3, if the temperature detection module detects that the temperature in the frequency converter 50 is equal to or higher than the switching temperature T, closing the first cooling loop, and opening the second cooling loop.

In one of the embodiments, the opening degree of the electronic expansion valve 72 is controlled by comparing whether the temperature of the frequency converter 50 exceeds the target temperature range T0 (Ta, Tb) or not, wherein Ta<Tb<T; if the temperature detection module detects that the temperature of the frequency converter 50 is within the target temperature range T0, the opening degree of the electronic expansion valve 72 is maintained at the current opening degree without any change; if the temperature detection module detects that the temperature of the frequency converter 50 is higher than Tb, the opening degree of the electronic expansion valve 72 is increased; and if the temperature detection module detects that the temperature of the frequency converter 50 is lower than Ta, the opening degree of the electronic expansion valve 72 is reduced.

In one of the embodiments, the opening and closing of the third solenoid valve 73 is controlled according to a set temperature T1 of a first frequency converter and a set temperature T2 of a second frequency converter, wherein T2<T0<T1<T; if the temperature detection module detects that the temperature of the frequency converter 50 is higher than the set temperature T1 of the first frequency converter, the third solenoid valve 73 is opened, the opening degree of the electronic expansion valve 72 is continuously increased until reaching the maximum opening degree; if the temperature detection module detects that the temperature of the frequency converter 50 is lower than the set temperature T2 of the second frequency converter, the third solenoid valve 73 is closed, and afterwards the operation of the opening degree of the electronic expansion valve 72 is controlled by comparing whether the temperature of the frequency converter 50 exceeds the target temperature range T0 or not.

In one of the embodiments, after the second cooling loop is opened, if the third solenoid valve 73 is closed, and the operating opening degree of the electronic expansion valve 72 is smaller than a set opening degree all the time within a set time, the cooling system is switched to the first cooling loop, and the second cooling loop is closed; during switching, as the compressor unit 10 is under a high-load working condition, in order to maintain normal temperature of the frequency converter, the third solenoid valve 73 is firstly opened, subsequently the first solenoid valve 30 is opened, and then the second solenoid valve 41 is closed to complete the switching.

In one embodiment, the predetermined time is 1 min to 60 min, for example, the predetermined time may be 10 min, 15 min, 20 min, 25 min, 30 min, 35 min, 40 min, 45 min, 50 min or 55 min.

In one embodiment, the set opening degree is smaller than or equal to 25% of the maximum opening degree. In this embodiment, the set opening degree is chosen to be 25% of the maximum opening degree.

The technical features of the above-mentioned embodiments can be combined randomly; in order to make the description concise, not all possible combinations of the various technical features in the above-mentioned embodiments are described, however, as long as there is no contradiction in the combinations of these technical features, all should be considered as the scope of this specification.

The above-mentioned embodiments only express several implementation modes of the present application, and the description thereof is relatively specific and detailed, but it should not be understood as a limitation to the patent scope of the present application. It should be noted that, for those of ordinary skill in the art, without departing from the concept of the present application, a plurality of modifications and improvements can be made as well, which all fall within the protection scope of the present application. Therefore, the protection scope of the present application depends on the claims described.

The invention claimed is:

1. A cooling system, comprising a compressor unit, a condenser, a first solenoid valve, a second solenoid valve, a first throttle valve, and a frequency converter, wherein the second solenoid valve and the first throttle valve are connected in series and connected with the first solenoid valve in parallel; the compressor unit, the condenser, the first solenoid valve, and the frequency converter are connected in series to form a first cooling loop; the compressor unit, the condenser, the second solenoid valve, the first throttle valve, and the frequency converter are connected in series to form a second cooling loop; and the frequency converter is internally provided with a temperature detector and a heat exchange module;

wherein if the temperature detector detects that a temperature in the frequency converter is lower than a switching temperature T, the first solenoid valve is opened, the second solenoid valve is closed, the first cooling loop is opened, and the second cooling loop is closed; and if the temperature detector detects that the temperature in the frequency converter is equal to or higher than the switching temperature T, the first solenoid valve is closed, the second solenoid valve is opened, the first cooling loop is closed, and the second cooling loop is opened.

2. The cooling system according to claim 1, further comprising a cooling capacity adjustment module, the cooling capacity adjustment module includes at least one cooling capacity adjustment assembly, and each cooling capacity adjustment assembly comprises an electronic expansion valve, and is located between the compressor unit and the frequency converter to adjust the flow of the refrigerant passing through the frequency converter.

3. The cooling system according to claim 2, wherein at least two cooling capacity adjustment assemblies are provided, and the cooling capacity adjustment assemblies are arranged in parallel.

4. The cooling system according to claim 2, wherein each cooling capacity adjustment assembly further comprises a third solenoid valve connected in parallel with the electronic expansion valve.

5. The cooling system according to claim 1, wherein the frequency converter is internally provided with an inverter module, a rectifier module and a reactor.

6. The cooling system according to claim 2, further comprising an evaporator located between the cooling capacity adjustment assembly and the compressor unit.

7. A control method of the cooling system according to claim 1, comprising the following steps of:
 detecting the temperature in the frequency converter by using the temperature detector;
 determining the temperature in the frequency converter is lower than a switching temperature T, and in response:
 opening the first solenoid valve, closing the second solenoid valve, opening the first cooling loop, and closing the second cooling loop.

8. A control method of the cooling system according to claim 2, comprising the following steps of:
 detecting the temperature in the frequency converter by using the temperature detector;
 determining the temperature in the frequency converter is lower than the switching temperature T, and in response:
 opening the first solenoid valve, closing the second solenoid valve, opening the first cooling loop, and closing the second cooling loop; and
 controlling an opening degree of the electronic expansion valve according to whether the temperature of the frequency converter exceeds a target temperature range T0 (Ta, Tb) or not, wherein Tb<T; if the temperature detector detects that the temperature of the frequency converter is within the target temperature range T0, maintaining the opening degree of the electronic expansion valve at a predetermined size; if the temperature detector detects that the temperature of the frequency converter is higher than Tb, increasing the opening degree of the electronic expansion valve; if the temperature detector detects that the temperature of the frequency converter is lower than the target temperature range Ta, reducing the opening degree of the electronic expansion valve.

9. A control method of the cooling system according to claim 4, comprising the following steps of:
 detecting the temperature in the frequency converter by using the temperature detector;
 determining the temperature in the frequency converter is equal to or higher than the switching temperature T, and in response to determining the temperature in the frequency converter is equal to or higher than the switching temperature T: closing the first solenoid valve, opening the second solenoid valve, closing the first cooling loop, and opening the second cooling loop;
 wherein, an opening degree of the electronic expansion valve is controlled according to whether the temperature of the frequency converter exceeds a target temperature range T0 (Ta, Tb) or not, wherein Tb<T; if the temperature detector detects that the temperature of the frequency converter is within the target temperature range T0, the opening degree of the electronic expansion valve is maintained at a predetermined size; if the temperature detector detects that the temperature of the frequency converter is higher than Tb, the opening degree of the electronic expansion valve is increased; if the temperature detector detects that the temperature of the frequency converter is lower than the target temperature range Ta, the opening degree of the electronic expansion valve is reduced; and
 the opening and closing of the third solenoid valve is controlled according to a set temperature T1 of a first frequency converter and a set temperature T2 of a second frequency converter, wherein T2<Ta<Tb<T1<T; if the temperature detector detect or detects that the temperature of the frequency converter is higher than the set temperature T1 of the first frequency converter, the third solenoid valve is opened, the opening degree of the electronic expansion valve is continuously increased until reaching a greatest opening degree possible; if the temperature detector detects that the temperature of the frequency converter is lower than the set temperature T2 of the second frequency converter, the third solenoid valve, and afterwards the operation of the opening degree of the electronic expansion valve is controlled by comparing whether the temperature of the frequency converter exceeds the target temperature range T0 or not.

10. The control method of the cooling system according to claim 9, wherein after the second cooling loop is opened, determining the third solenoid valve is closed and the operating opening degree of the electronic expansion valve is smaller than a set opening degree all the time within a set time, and in response the cooling system is switched to the first cooling loop, and the second cooling loop is closed; during switching, the third solenoid valve is firstly opened, subsequently the first solenoid valve is opened, and then the second solenoid valve is closed to complete the switching.

11. The control method of the cooling system according to claim 10, wherein the set time is 1 min to 60 min.

12. The control method of the cooling system according to claim 10, wherein the set opening degree is smaller than or equal to 25% of the greatest opening degree possible.

13. A control method of the cooling system according to claim 1, comprising the following steps of:
 detecting the temperature in the frequency converter by using the temperature detector;
 determining the temperature in the frequency converter is equal to or higher than a switching temperature T; and in response,
 closing the first solenoid valve, opening the second solenoid valve, closing the first cooling loop, and opening the second cooling loop.

14. A control method of the cooling system according to claim 2, comprising the following steps of:
 detecting the temperature in the frequency converter by using the temperature detector;
 determining the temperature in the frequency converter is equal to or higher than the switching temperature T; and in response,
 closing the first solenoid valve, opening the second solenoid valve, closing the first cooling loop, and opening the second cooling loop.

15. A control method of the cooling system according to claim 4, comprising the following steps of:

detecting the temperature in the frequency converter by using the temperature detector;

determining the temperature in the frequency converter is lower than the switching temperature T; and in response, opening the first solenoid valve, closing the second solenoid valve, opening the first cooling loop, and closing the second cooling loop.

\* \* \* \* \*

UNITED STATES PATENT AND TRADEMARK OFFICE
CERTIFICATE OF CORRECTION

| | |
|---|---|
| PATENT NO. | : 11,668,500 B2 |
| APPLICATION NO. | : 17/261656 |
| DATED | : June 6, 2023 |
| INVENTOR(S) | : Hua Liu et al. |

It is certified that error appears in the above-identified patent and that said Letters Patent is hereby corrected as shown below:

On the Title Page

Column 1, item (22) PCT Filed, Line 1, delete "Jul. 27," and insert -- Dec. 19, --

In the Claims

Column 12, Line 17, Claim 9, after "detector" delete "detect or"

Signed and Sealed this
First Day of August, 2023

*Katherine Kelly Vidal*

Katherine Kelly Vidal
*Director of the United States Patent and Trademark Office*